(12) United States Patent
Ko

(10) Patent No.: US 12,451,065 B2
(45) Date of Patent: Oct. 21, 2025

(54) PIXEL CIRCUIT AND DISPLAY APPARATUS COMPRISING PIXEL CIRCUIT

(71) Applicant: LG Display Co., Ltd., Seoul (KR)

(72) Inventor: Intae Ko, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/396,407

(22) Filed: Dec. 26, 2023

(65) Prior Publication Data

US 2024/0242669 A1 Jul. 18, 2024

(30) Foreign Application Priority Data

Jan. 16, 2023 (KR) .................. 10-2023-0006383

(51) Int. Cl.
*G06F 3/038* (2013.01)
*G09G 3/3233* (2016.01)

(52) U.S. Cl.
CPC ... *G09G 3/3233* (2013.01); *G09G 2300/0819* (2013.01); *G09G 2300/0852* (2013.01); *G09G 2300/0861* (2013.01); *G09G 2310/0294* (2013.01); *G09G 2310/08* (2013.01); *G09G 2320/02* (2013.01); *G09G 2330/028* (2013.01)

(58) Field of Classification Search
CPC ......... G09G 3/3233; G09G 2300/0819; G09G 2300/0852; G09G 2300/0861

USPC ....................................................... 345/211
See application file for complete search history.

(56) References Cited

U.S. PATENT DOCUMENTS

| | | |
|---|---|---|
| 2021/0375192 A1* | 12/2021 | Jeon ..................... G09G 3/3233 |
| 2023/0042966 A1* | 2/2023 | Huangfu ............... G09G 3/3258 |
| 2024/0144880 A1* | 5/2024 | Zhu ....................... G09G 3/3233 |

FOREIGN PATENT DOCUMENTS

KR 10-2022-0096133 A 7/2022

* cited by examiner

*Primary Examiner* — Jonathan M Blancha
(74) *Attorney, Agent, or Firm* — Morgan, Lewis & Bockius LLP

(57) ABSTRACT

A pixel circuit according to an exemplary embodiment of the present disclosure may include a driving transistor including a gate electrode, a first electrode, and a second electrode; a capacitor connected to the gate electrode; a first transistor connected to the gate electrode and the second electrode; a second transistor which is connected to the first transistor and receives an initialization voltage; a third transistor which is connected to the capacitor and receives the initialization voltage; a fourth transistor connected to the first transistor and the second electrode; a fifth transistor connected to the first transistor, the third transistor, and the fourth transistor; and a light emitting diode connected to the fourth transistor and the fifth transistor.

8 Claims, 10 Drawing Sheets

PIXEL CIRCUIT AND DISPLAY APPARATUS COMPRISING PIXEL CIRCUIT

CROSS-REFERENCE TO RELATED APPLICATIONS

This application claims the priority of Korean Patent Application No. 10-2023-0006383 filed on Jan. 16, 2023, in the Korean Intellectual Property Office, the disclosure of which is incorporated herein by reference.

BACKGROUND

Technical Field

The present disclosure relates to a pixel circuit and a display apparatus including the pixel circuit.

Discussion of the Related Art

An organic light emitting display apparatus includes an organic light emitting diode OLED which is a self-emitting diode and is used for various purposes with the advantages of a fast response speed, large luminous efficiency, luminance, and viewing angle.

The organic light emitting display apparatus includes an organic light emitting diode and adjusts a luminance of the pixels disposed in a matrix in accordance with a gray scale level of video data. Each pixel includes an organic light emitting diode, a driving transistor which controls a driving current flowing through the organic light emitting diode in accordance with a gate-source voltage, and at least one switching transistor which programs the gate-source voltage.

Various voltages may be input to the pixel circuit to drive the pixel circuit. The voltage of the pixel circuit forms a path of the current flow on the pixel circuit and in some cases, short may be caused between different voltages. In this case, the degradation of the image quality such as a black floating is caused so that a way to improve this problem is demanded.

SUMMARY

Accordingly, embodiments of the present disclosure are directed to a pixel circuit and a display apparatus comprising the pixel circuit that substantially obviates one or more of the problems due to limitations and disadvantages of the related art.

An aspect of the present disclosure is to provide a pixel circuit which changes a path of a current flow in which the short may occur to suppress the short to improve a display quality and a display apparatus including the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a pixel circuit comprises: a driving transistor including a gate electrode, a first electrode, and a second electrode; a capacitor connected to the gate electrode; a first transistor connected to the gate electrode and the second electrode; a second transistor which is connected to the first transistor and receives an initialization voltage; a third transistor which is connected to the capacitor and receives the initialization voltage; a fourth transistor connected to the first transistor and the second electrode; a fifth transistor connected to the first transistor, the third transistor, and the fourth transistor; and a light emitting diode connected to the fourth transistor and the fifth transistor.

In another aspect, a display apparatus comprises: a display panel which includes a pixel circuit, a power source which is electrically connected to the display panel to supply at least one of a high potential voltage, a low potential voltage, an initialization voltage, and a reference voltage; a data driving circuit which is electrically connected to the display panel to supply a data voltage; and a gate driving circuit which is electrically connected to the display panel to supply at least one of a first scan signal, a second scan signal, and an emission signal, wherein the pixel circuit includes: a driving transistor including a gate electrode, a first electrode, and a second electrode; a capacitor connected to the gate electrode; a first transistor connected to the gate electrode and the second electrode; a second transistor which is connected to the first transistor and receives the initialization voltage; a third transistor which is connected to the capacitor and receives the initialization voltage; a fourth transistor connected to the first transistor and the second electrode; a fifth transistor connected to the first transistor, the third transistor, and the fourth transistor; and a light emitting diode connected to the fourth transistor and the fifth transistor.

Other detailed matters of the exemplary embodiments are included in the detailed description and the drawings.

According to the present disclosure, the pixel circuit and the display apparatus change the path of the current flow to suppress the short, thereby improving the display quality.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
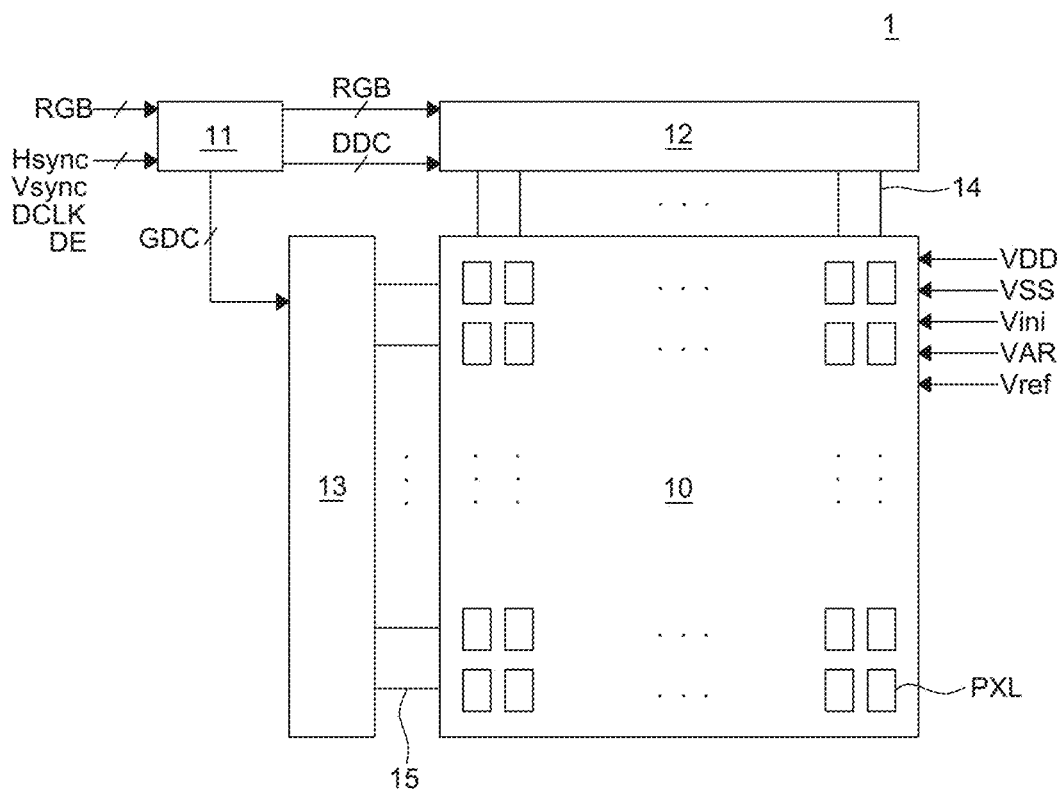
FIG. 1 is a block diagram of a display apparatus according to an exemplary embodiment of the present disclosure.

The terms used in the embodiments of this specification have been selected from general terms that are currently widely used as much as possible while considering the functions in the present disclosure, but they may vary depending on the intention or precedent of a person skilled in the art, the emergence of new technologies, and the like. In a specific case, there is a term arbitrarily selected by the applicant, and in this case, the meaning will be described in detail in the corresponding description. Therefore, the term used in this specification should be defined based on the meaning of the term and the overall content of the present disclosure, not simply the name of the term.

When it is said that a certain part "includes" a certain component throughout the specification, it means that it may further include other components, not excluding other components unless otherwise state.

Expressions of "at least one of a, b, and c" described throughout the specification include 'a alone', 'b alone', 'c alone', 'a and b', 'a and c', 'b and c', or 'all a, b, and c'. Advantages and features of the present invention, and methods of achieving them, will become clear with reference to the embodiments described below in detail in conjunction with the accompanying drawings.

The shapes, sizes, ratios, angles, numbers, and the like illustrated in the accompanying drawings for describing the exemplary embodiments of the present disclosure are merely examples, and the present disclosure is not limited thereto. Further, in the following description of the present disclosure, a detailed explanation of known related technologies may be omitted to avoid unnecessarily obscuring the subject matter of the present disclosure.

The terms such as "including," "having," and "consist of" used herein are generally intended to allow other components to be added unless the terms are used with the term "only". Any references to singular may include plural unless expressly stated otherwise.

When the position relation between two parts is described using the terms such as "on", "above", "below", and "next", one or more parts may be positioned between the two parts unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely adhered to or combined with each other and can be interlocked and operated in technically various ways, and the embodiments can be carried out independently of or in association with each other.

In addition, the terms that will be described later are defined in consideration of the functions in the implementation of this specification, which may change depending on the intention of the user, operator, or custom. Therefore, the definition should be made based on the contents throughout the specification.

The following exemplary embodiments will be described with respect to an organic light emitting display apparatus. However, exemplary embodiments of the present disclosure are not limited to an organic light emitting display apparatus, but may be applied to various electroluminescent display apparatuses. For example, the electroluminescent display apparatus may use an organic light emitting diode (OLED) display apparatus, a quantum dot light emitting diode display apparatus, or an inorganic light emitting diode display apparatus.

Hereinafter, exemplary embodiments of the present disclosure will be described with reference to the drawings.

FIG. 1 is a block diagram of a display apparatus according to an exemplary embodiment of the present disclosure.

Referring to FIG. 1, the display apparatus 1 according to an exemplary embodiment includes a display panel 10 in which a sub pixel PXL for internal compensation is disposed, a data driving circuit (data driver) 12 which drives data lines 14, a gate driving circuit (gate driver) 13 which drives gate lines 15, and a timing controller T-con 11. The timing controller 11 controls driving timings of the data driving circuit 12 and the gate driving circuit 13. For example, the gate driving circuit 13 may be a first driving circuit, but is not limited by the term. For example, the data driving circuit 12 may be a second driving circuit, but is not limited by the term.

In the display panel 10, a plurality of data lines 14 and a plurality of gate lines 15 intersect and a plurality of sub pixels PXL for internal compensation may be disposed in the intersecting area of the data lines 14 and/or the gate lines 15. In the display panel 10, an area where the sub pixels PXL are disposed is referred to as an active area. Hereinafter, the active area is denoted by AA.

The sub pixels PXL may be disposed in a matrix as illustrated in the drawing, but is not limited thereto. Sub pixels PXL disposed in the same pixel row are connected to the plurality of gate lines 15 and the plurality of gate lines 15 includes at least one scan line and at least one emission signal line.

For example, each sub pixel PXL may be connected to one data line 14 and at least one of the scan lines and the emission control lines. The sub pixels PXL are commonly supplied with at least one of a high potential voltage VDD, a low potential voltage VSS, an initialization voltage Vini, and a reset voltage VAR, from a power source. Each of the high potential voltage VDD, the low potential voltage VSS, the initialization voltage Vini, and the reset voltage VAR may have a predetermined voltage value. The high potential voltage VDD may have a higher voltage value than the low potential voltage VSS.

Transistors (thin film transistors: TFT) which configure the sub pixel PXL may be implemented by oxide transistors (or oxide TFTs) including an oxide semiconductor layer. The oxide TFT may be advantageous in increasing a size of the display panel 10 in consideration of the electron mobility, the process deviation, and the like. However, the exemplary embodiments of the present disclosure are not limited thereto and the semiconductor layer of the TFT may be formed by an amorphous silicon TFT (a-Si TFT) or a low temperature polysilicon (LTPS) TFT.

Each subpixel PXL includes a plurality of TFTs and a plurality of capacitors to compensate for a deviation of a threshold voltage Vth of the driving TFT. A specific configuration of each sub pixel PXL will be described in detail below.

In FIG. 1, a basic pixel may be configured by at least three sub pixels of white (W), red (R), green (G), and blue (B) sub pixels. For example, the basic pixel may be configured by sub pixels of a combination of red (R), green (G), and blue (B), sub pixels of a combination of white (W), red (R), and green (G), sub pixels of a combination of blue (B), white (W), and red (R), or sub pixels of a combination of green (G), blue (B), and white (W). Further, the basic pixel may be configured by sub pixels of a combination of white (W), red (R), green (G), and blue (B), but the exemplary embodiment of the present disclosure is not limited thereto.

The timing controller 11 rearranges digital video data RGB input from the outside in accordance with a resolution of the display panel 10 to supply the digital video data to the data driving circuit 12. Further, the timing controller 11 may generate a data control signal DDC for controlling an operation timing of the data driving circuit 12 and a gate control signal GDC for controlling an operation timing of the gate driving circuit 13, based on timing signals such as a vertical synchronization signal Vsync, a horizontal synchronization signal Hsync, a dot clock signal DCLK, and a data enable signal DE.

The data driving circuit 12 converts digital video data RGB input from the timing controller 11 into an analog data voltage based on the data control signal DDC, for example, converts the digital video data into a data voltage Vdata of FIG. 2 to be described below to supply the converted data voltage to a plurality of data lines 14.

The gate driving circuit 13 may generate a scan signal and an emission signal based on the gate control signal GDC. The scan signal may include a first scan signal Scan1 and a second scan signal Scan2 of FIG. 4 to be described below. The emission signal may include an emission signal EM of FIG. 4 to be described below.

In the exemplary embodiment, the gate driving circuit 13 may include a scan driver, an emission signal driver, and an initialization voltage driver. The scan driver generates a scan signal in a row sequential manner to drive at least one scan line connected to each pixel row to supply the scan signal to the scan lines. The emission signal driver generates an emission signal in a row sequential manner to drive at least one emission signal line connected to each pixel row to supply the emission signal to the emission signal lines. The initialization voltage driver generates an initialization voltage in a row sequential manner to drive at least one initialization voltage line connected to each pixel row to supply the initialization voltage to the initialization voltage lines.

According to an exemplary embodiment, the gate driving circuit 13 may be embedded in the non-active area of the display panel 10 by a gate-driver in panel (GIP) manner, but is not limited thereto. Even though in FIG. 1, it is illustrated that the gate driving circuit 13 is disposed on one side surface of the display panel 10, if necessary, a plurality of gate driving circuits 13 may be included and may be disposed on at least two side surfaces of the display panel 10. However, it is not limited thereto and the gate driving circuit 13 may be disposed in the display panel 10 in various placement manners.

Figure 2:
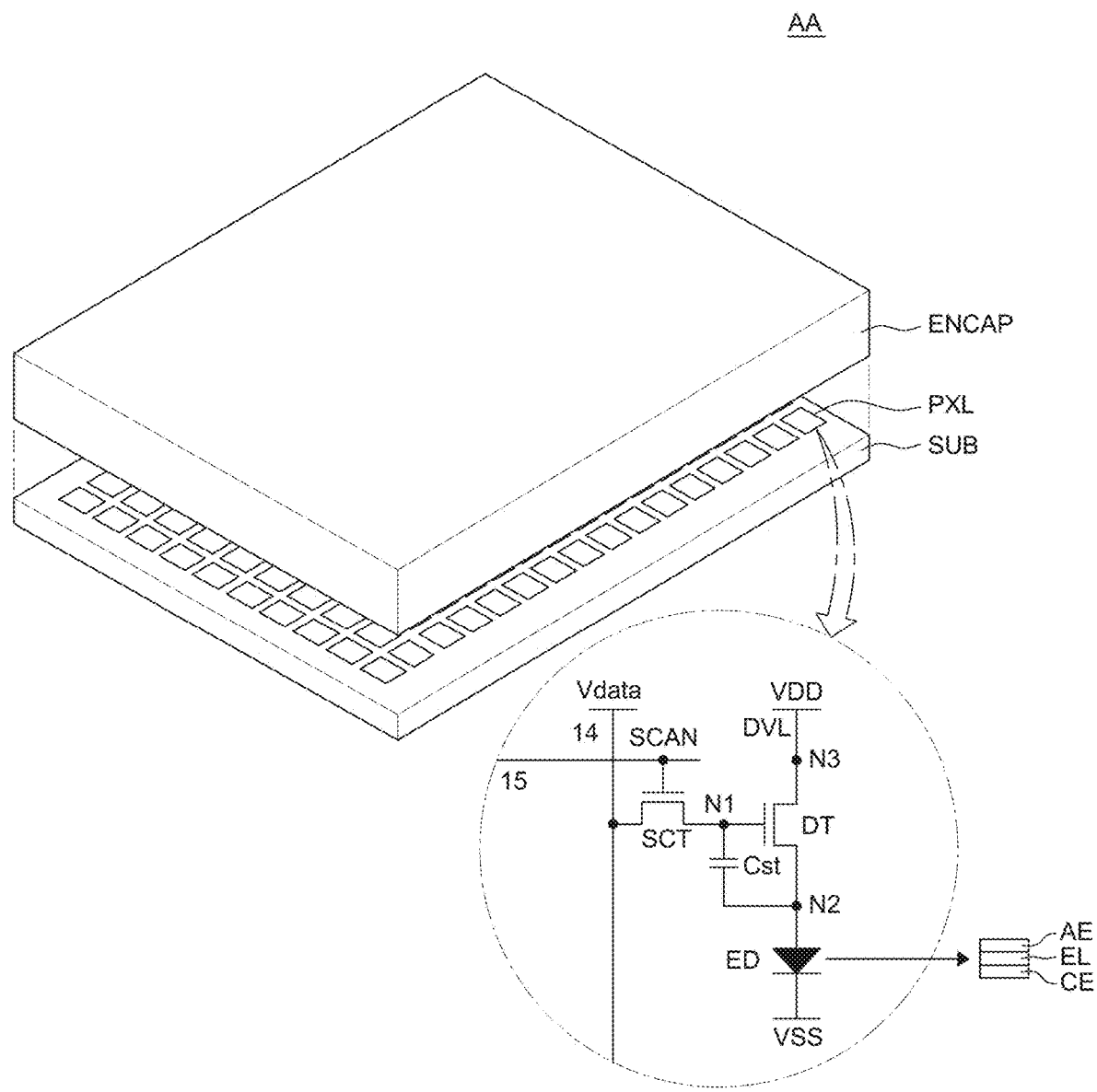
FIG. 2 is a view for explaining the placement of a pixel circuit of a display apparatus according to an exemplary embodiment of the present disclosure.

FIG. 2 is a view for explaining a pixel circuit of a display apparatus according to an exemplary embodiment of the present disclosure. FIG. 2 illustrates an active area AA of the display panel.

Referring to FIG. 2, in the active area AA, the display panel 10 includes a circuit board SUB including sub pixels PXL and an encapsulation layer ENCAP disposed on the circuit board SUB. Each sub pixel PXL may include a light emitting diode ED, a driving transistor DT for driving the light emitting diode ED, a scan transistor SCT for transmitting a data voltage Vdata to a first node N1 of the driving transistor DT, a storage capacitor Cst for maintaining a constant voltage for one frame, and the like.

The driving transistor DT may include a first node N1 to which the data voltage Vdata is applied, a second node N2 which is electrically connected to the light emitting diode ED, and a third node N3 to which a high potential voltage VDD is applied from a driving voltage line DVL. In the driving transistor DT, the first node N1 may be a gate node, the second node N2 may be a source node or a drain node, and the third node N3 may be a drain node or a source node.

The light emitting diode ED may include an anode electrode AE, an emission layer EL, and a cathode electrode CE. The anode electrode AE may be a pixel electrode disposed in each sub pixel PXL and may be electrically connected to the second node N2 of the driving transistor DT of each sub pixel PXL. The cathode electrode CE may be a common electrode which is commonly disposed in a plurality of sub pixels PXL and may be applied with a low potential voltage VSS.

For example, the anode electrode AE may be a pixel electrode and a cathode electrode CE may be a common electrode. In contrast, the anode electrode AE may be a common electrode and the cathode electrode CE may be a pixel electrode. Hereinafter, for the convenience of description, it is assumed that the anode electrode AE is a pixel electrode and the cathode electrode CE is a common electrode.

For example, the light emitting diode ED may be an organic light emitting diode, an inorganic light emitting diode, a quantum dot light emitting diode, and the like. When the light emitting diode ED is an organic light emitting diode, in the light emitting diode ED, the emission layer EL may include an organic emission layer including an organic material.

The scan transistor SCT is controlled to be turned on/off by a scan signal SCAN which is a gate signal applied through the gate line 15. The scan transistor SCT may be configured to switch the electrical connection between the first node N1 of the driving transistor DT and the data line 14.

The storage capacitor Cst may be electrically connected between the first node N1 and the second node N2 of the driving transistor DT.

As illustrated in FIG. 2, each sub pixel PXL may have a 2T (transistor) 1C (capacitor) structure including two transistors DT and SCT and one capacitor Cst. According to an exemplary embodiment, at least one sub pixel may further include one or more transistors or further include one or more capacitors.

The storage capacitor Cst may be a parasitic capacitor which is an internal capacitor located between the first node N1 and the second node N2 of the driving transistor DT. However, it is not limited thereto. For example, the storage capacitor Cst may be an external capacitor which is intentionally designed at the outside of the driving transistor DT.

Each of the driving transistor DT and the scan transistor SCT may be an n type transistor or a p type transistor. For example, the driving transistor DT may be a p type transistor and the scan transistor SCT may be an n type transistor.

According to the exemplary embodiment, at least one of the driving transistor DT and the scan transistor SCT uses the oxide semiconductor layer as an active layer. The oxide semiconductor layer is a layer configured by an oxide semiconductor material and has an excellent leakage current blocking effect and has a manufacturing cost cheaper than the transistor using the polycrystalline semiconductor layer. For example, the oxide semiconductor layer may include IGZO, ZnO, $SnO_2$, $Cu_2O$, NiO, ITZO, and/or IAZO, but the exemplary embodiments of the present disclosure are not limited thereto.

A transistor using a polycrystalline semiconductor layer, including a polycrystalline semiconductor material, for example, polycrystalline silicon (poly-Si) has a fast operation speed and an excellent reliability. According to the exemplary embodiment, at least one of the driving transistor DT and the scan transistor SCT may be manufactured using a polycrystalline semiconductor layer based on the advantage of the polycrystalline semiconductor layer.

Circuit elements (specifically, a light emitting diode ED) in each sub pixel PXL are vulnerable to external moisture or oxygen. Therefore, an encapsulation layer ENCAP for suppressing the permeation of external moisture or oxygen into the circuit elements (specifically, the light emitting diode ED) may be disposed on the display panel (for example, the display panel 10 of FIG. 1). The encapsulation layer ENCAP may be disposed so as to cover the light emitting diodes ED. For example, the encapsulation layer ENCAP may be disposed so as to fully cover the light emitting diodes ED.

Figure 3:
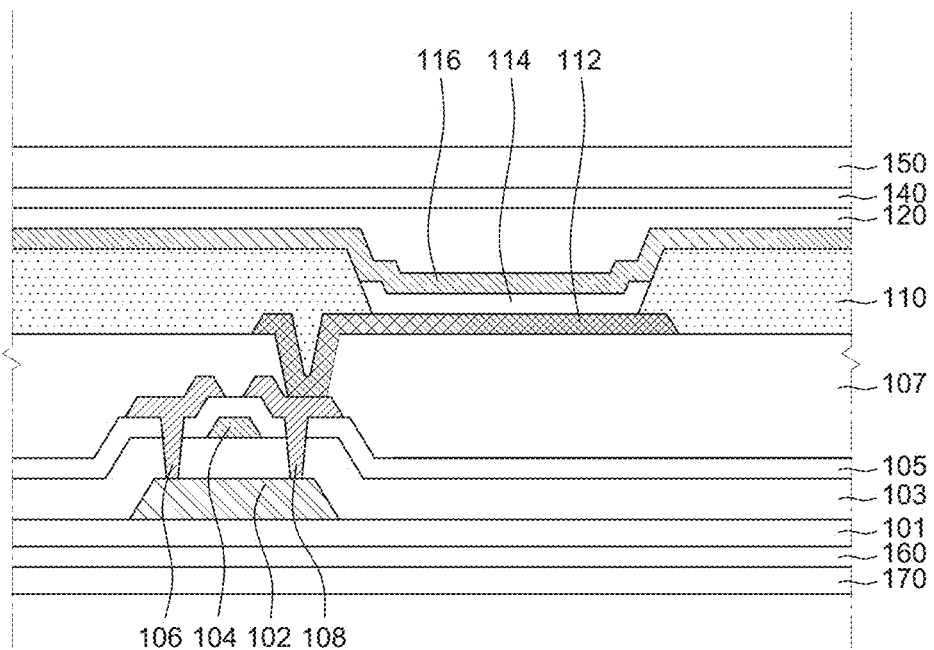
FIG. 3 is a view illustrating an example of a pixel circuit of a display apparatus.

FIG. 3 is a view illustrating a cross-section of at least a part of a display apparatus according to an exemplary embodiment of the present disclosure. For example, FIG. 3 illustrates a cross-section of at least a part of the active area of the display apparatus of FIG. 2. In FIG. 3, it is described that the light emitting diode ED disposed in the display apparatus is an organic light emitting diode as an example.

Referring to FIG. 3, transistors 102, 104, 106, and 108 and organic light emitting diodes 112, 114, and 116 are located on the substrate 101.

In the exemplary embodiment, the substrate 101 may be a glass or plastic substrate. When the substrate is a plastic substrate, a polyimide-based or polycarbonate-based material is used so that the substrate may have a flexibility. The substrate 101 may be configured as a multi-layer in which at least one organic film and at least one inorganic film are alternately laminated. For example, the substrate 101 may be formed by alternately laminating organic films such as polyimide and inorganic films such as silicon oxide SiOx, but the exemplary embodiments of the present disclosure are not limited thereto.

In the exemplary embodiment, the transistor may be formed by sequentially disposing a semiconductor layer 102, a gate insulating layer 103, a gate electrode 104, an interlayer insulating layer 105, source and drain electrodes 106 and 108, but the exemplary embodiments of the present disclosure are not limited thereto.

In the exemplary embodiment, the semiconductor layer 102 may be made of poly silicon (p-Si). In this case, a predetermined region may be doped with impurities. The semiconductor layer 102 may be made of amorphous silicon (a-Si) or various organic semiconductor materials such as pentacene. As another example, the semiconductor layer 102 may be made of oxide. When the semiconductor layer 102 is formed of polysilicon, amorphous silicon is used and is crystalized to be changed to polysilicon. As a crystallization method, various methods, such as rapid thermal annealing, metal induced lateral crystallization (MILC), or sequential lateral solidification (SLS) may be applied, but the exemplary embodiments of the present disclosure are not limited thereto.

In the exemplary embodiment, the gate insulating layer 103 may be formed of an insulating material, such as a silicon oxide (SiOx) film or a silicon nitride (SiNx) film or an insulating organic material. The gate electrode 104 may be formed of various conductive materials, for example, magnesium (Mg), aluminum (Al), nickel (Ni), chrome (Cr), molybdenum (Mo), tungsten (W), gold (Au), or an alloy thereof, but the exemplary embodiments of the present disclosure are not limited thereto.

In the exemplary embodiment, the interlayer insulating layer 105 may be formed of an insulating material, such as a silicon oxide (SiOx) film or a silicon nitride (SiNx) film or an insulating organic material. The interlayer insulating layer 105 and the gate insulating layer 103 are selectively removed to form contact holes through which the source and drain regions are exposed.

In the exemplary embodiment, the source and drain electrodes 106 and 108 may be formed on the interlayer insulating layer 105 as a single layer or a plurality of layers with a material for the gate electrode 104 so as to bury the contact hole.

In the exemplary embodiment, a passivation layer 107 may be located on the transistor. The passivation layer 107 protects and planarizes the transistor. The passivation layer 107 may be configured to have various shapes. The passivation layer 107 may be modified in various ways, for example, may be formed of an organic insulating film such as benzocyclobutene (BCB) or acryl or an inorganic insulating film such as a silicon nitride (SiNx) film or an silicon oxide (SiOx) film or may be formed of a single layer or double layers or a plurality of layers. However, the exemplary embodiments of the present disclosure are not limited thereto.

In the exemplary embodiment, the organic light emitting diode is formed by sequentially disposing a first electrode 112, an organic emission layer 114, and a second electrode 116. For example, the organic light emitting diode is configured by the first electrode 112 formed on the passivation layer 107, the organic emission layer 114 located on the first electrode 112, and the second electrode 116 located on the organic emission layer 114.

In the exemplary embodiment, the first electrode 112 is electrically connected to the drain electrode 108 of the transistor through the contact hole. The first electrode 112 may be formed of an opaque conductive material having a high reflectance. For example, the first electrode 112 may be a single layer or a plurality of layers formed by silver (Ag), aluminum (Al), aluminum nitride (AlN), gold (Au), molybdenum (Mo), tungsten (W), chrome (Cr), or an alloy of at least a part thereof, but the exemplary embodiments of the present disclosure are not limited thereto.

In the exemplary embodiment, a bank 110 is formed in a remaining area excluding an emission area. Therefore, the bank 110 has a bank hole which exposes the first electrode 112 corresponding to the emission area. The bank 110 may be formed of an inorganic insulating material, such as a silicon nitride (SiNx) film or a silicon oxide (SiOx) film or an organic insulating material, such as BCB, acrylic resin or imide resin, but the exemplary embodiments of the present disclosure are not limited thereto.

In the exemplary embodiment, the organic emission layer 114 is located on the first electrode 112 which is exposed by the bank 110. The organic emission layer 114 may include an emission layer, an electron injection layer, an electron transport layer, a hole transport layer and/or a hole injection layer, but the exemplary embodiments of the present disclosure are not limited thereto.

In the exemplary embodiment, the second electrode 116 is located on the organic emission layer 114. The second electrode 116 is formed of a transparent conductive material such as indium tin oxide (ITO) or indium zinc oxide (IZO) to emit light generated in the organic emission layer 114 above the second electrode 116.

In the exemplary embodiment, an upper encapsulation layer 120 is located on the second electrode 116. At this time, the upper encapsulation layer 120 may be configured by an inorganic film formed of glass, metal, aluminum oxide (AlOx), or silicon (Si) based material or have a structure in which organic films and inorganic films are alternately laminated, but the exemplary embodiments of the present disclosure are not limited thereto. The upper encapsulation layer 120 suppresses the permeation of the oxygen and moisture from the outside to suppress the oxidation of an emission material and an electrode material. When the organic light emitting diode is exposed to the moisture or oxygen, pixel shrinkage phenomenon in which the emission area is reduced may be caused or a dark spot may be generated in the emission area.

In an exemplary embodiment, a barrier film 150 is located on the upper encapsulation layer 120 to encapsulate the entire substrate 101 including the organic light emitting diode. The barrier film 150 may be a retardation film or an optically isotropic film. When the barrier film has an optical isotropy, light incident onto the barrier film may be transmitted as it is without delaying a phase. An organic film or an inorganic film may be further located on an upper surface or lower surface of the barrier film. The inorganic film may include a silicon oxide (SiOx) film or a silicon nitride (SiNx) film. The organic film may include a polymer material such as acrylic resin, epoxy resin, polyimide, or polyethylene, but the exemplary embodiments of the present disclosure are not limited thereto. The organic film or the inorganic film which is formed on an upper surface or a lower surface of the barrier film may block permeation of the external moisture or oxygen.

In the exemplary embodiment, an adhesive layer 140 may be located between the barrier film 150 and the upper encapsulation layer 120. The adhesive layer 140 bonds the upper encapsulation layer 120 and the barrier film 150 to each other. The adhesive layer 140 may be a thermal curable or natural curable adhesive, but the exemplary embodiments of the present disclosure are not limited thereto. For example, the adhesive layer 140 may be configured by a material such as a barrier pressure sensitive adhesive (B-PSA), but the exemplary embodiments of the present disclosure are not limited thereto.

In the exemplary embodiment, a lower adhesive layer 160 and a lower encapsulation layer 170 may be sequentially formed below the substrate 101. The lower encapsulation layer 170 may be formed of one or more organic materials of polyethylene naphthalate (PEN), polyethylene terephthalate (PET), polyethylene ether phthalate, polycarbonate, polyarylate, polyether imide, polyether sulfonate, polyimide, or polyacrylate. However, the exemplary embodiments of the present disclosure are not limited thereto. The lower encapsulation layer 170 serves to suppress the permeation of the moisture or oxygen into the substrate from the outside.

In the exemplary embodiment, the lower adhesive layer 160 is formed by a thermal curable or natural curable adhesive, and serves to bond the substrate 101 and the lower encapsulation layer 170. For example, the lower adhesive layer 160 may be formed of a material such as optically cleared adhesive (OCA).

Figure 4:
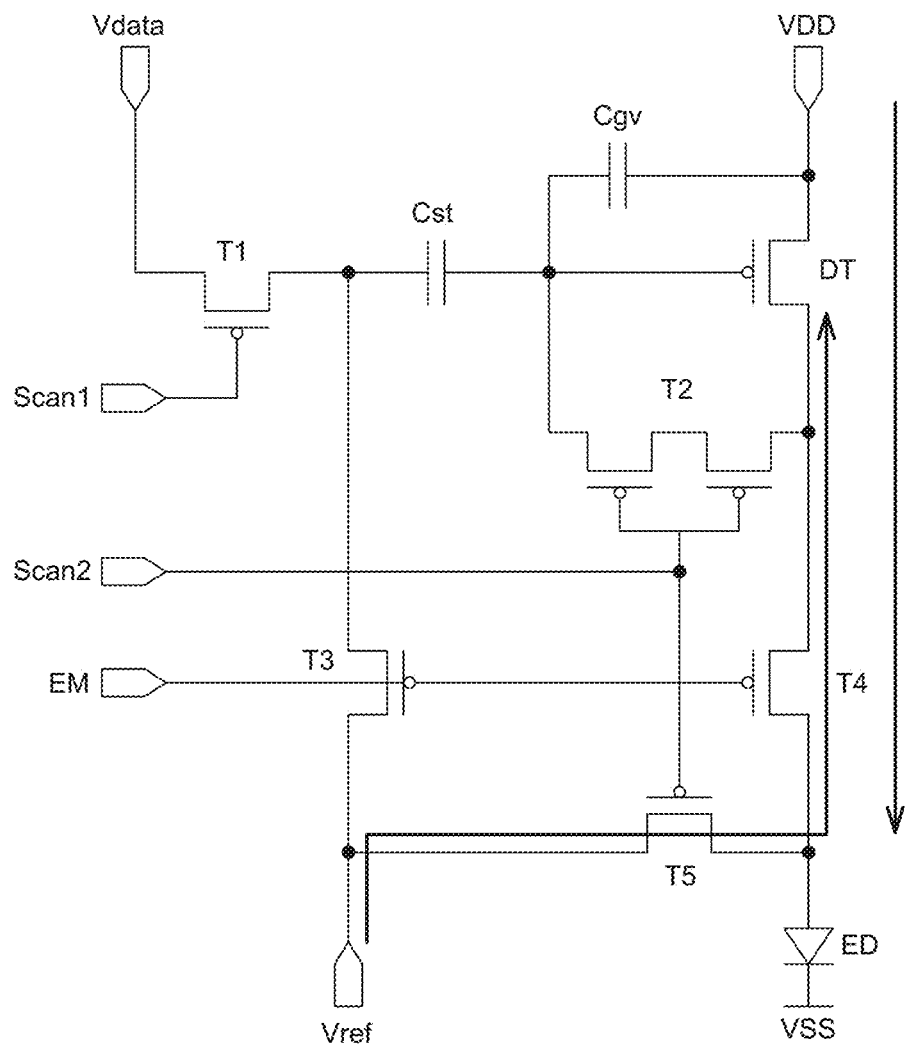
FIG. 4 is an equivalent circuit diagram of a pixel circuit of a display apparatus according to an exemplary embodiment of the present disclosure.

FIG. 4 is an equivalent circuit diagram of a pixel circuit of a display apparatus according to an exemplary embodiment of the present disclosure. FIG. 4 illustrates an example of a pixel circuit of a sub pixel PXL.

Referring to FIG. 4, the pixel circuit may include five transistors (thin film transistors) T1 to T5, a driving transistor DT, two capacitors Cst and Cgv, and a light emitting diode ED. The pixel circuit is supplied with at least one of a high potential voltage VDD, a low potential voltage VSS, a reference voltage Vref, and a data voltage Vdata.

In the exemplary embodiment, the pixel circuit may have an initialization period (or an initial period) in which the storage capacitor Cst is initialized. However, in some cases, in the initialization period, a second transistor T2 and a fourth transistor T4 may be simultaneously turned on by a second scan signal Scan2 and an emission signal EM. In this case, as illustrated in the drawing, the high potential voltage VDD and the reference voltage Vref may be shorted. As the high potential voltage VDD and the reference voltage Vref are shorted, a quality of the pixel circuit may be degraded.

A pixel circuit of FIG. 5 to be described below may suppress the short phenomenon which causes the quality degradation. Further, the pixel circuit of FIG. 5 may suppress the shaking phenomenon of the power terminal and also improve poor image quality caused by the shaking phenomenon.

Figure 5:
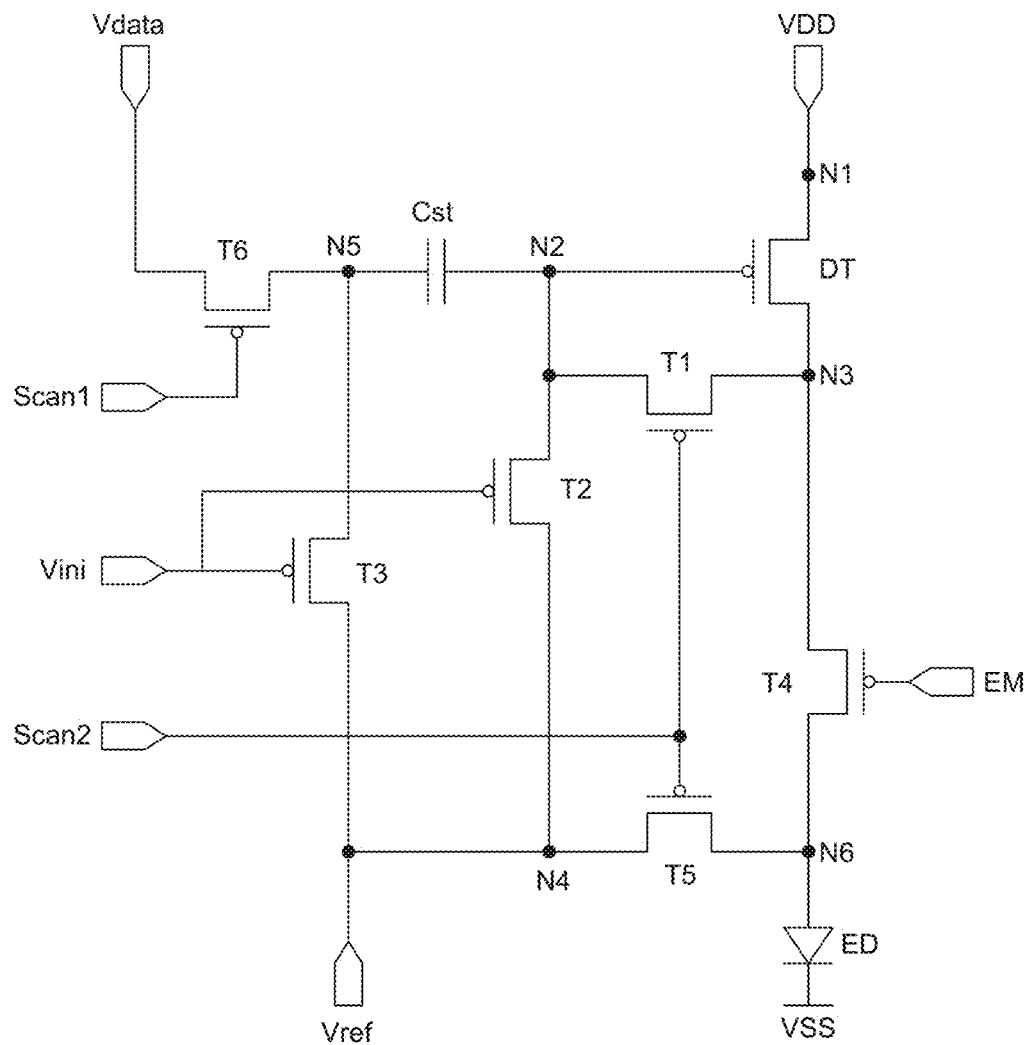
FIG. 5 is a view for explaining the driving of a pixel circuit of a display apparatus according to an exemplary embodiment of the present disclosure.

FIG. 5 is an equivalent circuit diagram of a pixel circuit of a display apparatus according to another exemplary embodiment of the present disclosure. FIG. 5 illustrates an example of a pixel circuit of a sub pixel PXL.

Referring to FIG. 5, the pixel circuit may include six transistors T1 to T6, a driving transistor DT, a capacitor Cst, and a light emitting diode ED. The pixel circuit may be supplied with at least one of a high potential voltage VDD, a low potential voltage VSS, an initialization voltage Vini, a reference voltage Vref, and a data voltage Vdata. The high potential voltage VDD, the low potential voltage VSS, and the reference voltage Vref may be DC voltages (or direct current voltages) and the data voltage Vdata may be an AC voltage (or an alternating current voltage).

In the exemplary embodiment, the pixel circuit may be connected to a high potential power line which supplies the high potential voltage VDD, a low potential power line which supplies the low potential voltage VSS, an initialization voltage line which supplies the initialization voltage Vini, a data voltage line which supplies the data voltage Vdata, and a reference voltage line which supplies the reference voltage Vref. The high potential voltage VDD may be a first voltage and the low potential voltage VSS may be a second voltage which is lower than the first voltage.

In the exemplary embodiment, a magnitude of a voltage supplied through the low potential power line, for example, the low potential voltage VSS is smaller than a magnitude of a voltage supplied through the high potential power line, for example, the high potential voltage VDD. The magnitude of a voltage supplied through the high potential power line is larger than the magnitude of a voltage supplied through the low potential power line.

In the exemplary embodiment, the high potential voltage VDD, the low potential voltage VSS, the initialization voltage Vini, the reference voltage Vref, and the data voltage Vdata may be supplied from the power source. However, it is not limited thereto and at least two of the high potential voltage VDD, the low potential voltage VSS, the initialization voltage Vini, the reference voltage Vref, and the data voltage Vdata may be supplied from different configurations, respectively. For example, the initialization voltage Vini may be supplied from an initialization voltage circuit and the high potential voltage VDD, the low potential voltage VSS, the reference voltage Vref, and the data voltage Vdata may be supplied from the power source.

In the exemplary embodiment, the pixel circuit may be connected to a first scan line which supplies a first scan signal Scan1, a second scan line which supplies a second scan signal Scan2, and an emission signal line which supplies an emission signal EM. The pixel circuit may be supplied with at least one of the first scan signal Scan1, the second scan signal Scan2, and the emission signal EM. The first scan signal Scan1, the second scan signal Scan2, and the emission signal EM may be supplied from a gate driving circuit (for example, the gate driving circuit 13 of FIG. 1) connected to the pixel circuit.

In the exemplary embodiment, at least some of transistors included in the pixel circuit may be controlled, for example, may be turned on or turned off, by a signal provided from the gate driving circuit. For example, the first transistor T1 and the fifth transistor T5 may be controlled by the second scan signal Scan2. The fourth transistor T4 may be controlled by the emission signal EM. A sixth transistor T6 may be controlled by the first scan signal Scan1.

At least some of transistors included in the pixel circuit may be controlled by a signal supplied from the data driving circuit. For example, the second transistor T2 and the third transistor T3 may be controlled by the initialization voltage Vini.

In the exemplary embodiment, the driving transistor DT and at least one of first to sixth transistors T1 to T6 may be p type transistors. However, it is not limited thereto and according to the exemplary embodiment, the driving transistor DT and at least one of first to sixth transistors T1 to T6 may be implemented as n type transistors. When the transistors are implemented as n type transistors, an oxide semiconductor layer may be included, but it is not limited thereto.

In the case of p type transistor, a low level voltage (or a low-level signal) of each driving signal (for example, the first scan signal Scan1, the second scan signal Scan2, and the emission signal EM) may be a gate-on voltage which turns on the transistors. Further, a high level voltage (or a high level signal) of each driving signal may be a gate-off voltage which turns off the transistors. In the case of n type transistor, a low level voltage of each driving signal may be a gate-off voltage which turns off the transistors and a high level voltage of each driving signal may be a gate-on voltage which turns on the transistors.

Here, the low level voltage may correspond to a predetermined voltage (or a previously set voltage) which is lower than a high level voltage. The high level voltage may correspond to a predetermined voltage (or a previously set voltage) which is higher than the low level voltage.

According to the exemplary embodiment of the present disclosure, the low level voltage may be a first voltage level and the high level voltage may be a second voltage level, but the exemplary embodiment of the present disclosure is not limited thereto. In this case, the first voltage level may be lower than the second voltage level. A first electrode or a second electrode of the transistor (for example, the driving transistor DT, the first to sixth transistors T1 to T6) to be described below may correspond to a source electrode or a drain electrode. For example, the first electrode may correspond to the source electrode and the second electrode may correspond to the drain electrode. As another example, the second electrode may correspond to the source electrode and the first electrode may correspond to the drain electrode.

The driving transistor DT is a transistor for driving the light emitting diode ED. The driving transistor DT may include a gate electrode, a first electrode, and a second electrode. The first electrode of the driving transistor DT may be connected to the first node N1. The gate electrode of the driving transistor DT may be connected to the second node N2. The second electrode of the driving transistor DT may be connected to the third node N3. The driving transistor DT may be turned on or turned off according to the voltage of the second node N2. When the driving transistor DT is turned on, the driving current according to the data voltage Vdata may be supplied to the third node N3.

The driving transistor DT may be connected to at least one of the capacitor Cst, the first transistor T1, the fourth transistor T4, and the high potential voltage line. For example, the first electrode of the driving transistor DT may be connected to the high potential voltage line. The driving transistor DT may be supplied with the high potential voltage VDD through the high potential voltage line. The second electrode of the driving transistor DT may be connected to the first transistor T1 and the fourth transistor T4. For example, the second electrode of the driving transistor DT may be connected to the first electrode of the first transistor T1 and the first electrode of the fourth transistor T4. The gate electrode of the driving transistor DT may be connected to the capacitor Cst, the first transistor T1, and the second transistor T2. For example, the gate electrode of the driving transistor DT may be connected to the capacitor Cst, the second electrode of the first transistor T1, and the second electrode of the second transistor T2.

In the exemplary embodiment, the driving transistor DT may be connected to the first node N1, the second node N2, and the third node N3. For example, the first electrode of the driving transistor DT may be connected to the first node N1, the second electrode may be connected to the third node N3, and the gate electrode may be connected to the second node N2.

The first transistor T1 may be connected to at least one of the second scan line, the capacitor Cst, the driving transistor DT, the second transistor T2, the fourth transistor T4, and the fifth transistor T5. For example, the first electrode of the first transistor T1 may be connected to the second electrode of the driving transistor DT and the first electrode of the fourth transistor T4. The second electrode of the first transistor T1 may be connected to the gate electrode of the driving transistor DT, the capacitor Cst, and the second electrode of the second transistor T2. The gate electrode of the first transistor T1 may be connected to the second scan line and the fifth transistor T5. The first transistor T1 may be supplied with the second scan signal Scan2 through the second scan line.

In the exemplary embodiment, the first electrode of the first transistor T1 may be connected to the third node N3 and the second electrode of the first transistor T1 may be connected to the second node N2. In this case, the first transistor T1 may be connected to the gate electrode and the second electrode of the driving transistor DT. The gate electrode of the first transistor T1 may be connected to the second scan line. The first transistor T1 may be supplied with the second scan signal Scan2 through the second scan line.

In the exemplary embodiment, the second electrode of the first transistor T1 may be connected to the driving transistor DT, the second transistor T2, and the capacitor Cst. For example, the second electrode of the first transistor T1 may be connected to the second electrode of the second transistor T2, the gate electrode of the driving transistor DT, and the capacitor Cst.

The second transistor T2 may be connected to at least one of the initialization voltage line, the reference voltage line, the driving transistor DT, the first transistor T1, the third transistor T3, the fifth transistor T5, and the capacitor Cst. For example, the second transistor T2 may be connected to the first transistor T1 and receive an initialization voltage through the initialization voltage line.

As another example, the first electrode of the second transistor T2 may be connected to the reference voltage line, the first electrode of the third transistor T3, and the first electrode of the fifth transistor T5. The second transistor T2 may be supplied with the reference voltage Vref through the reference voltage line. The second electrode of the second transistor T2 may be connected to the gate electrode of the driving transistor DT, the second electrode of the first transistor T1, and the capacitor Cst. The gate electrode of the second transistor T2 may be connected to the initialization voltage line. The second transistor T2 may be supplied with the initialization voltage Vini through the initialization voltage line. The second transistor T2 may be turned on or turned off by the initialization voltage Vini.

In the exemplary embodiment, the second transistor T2 may be connected to the second node N2 and the fourth node N4. For example, the first electrode of the second transistor T2 may be connected to the fourth node N4. The second electrode of the second transistor T2 may be connected to the second node N2.

The third transistor T3 may be connected to at least one of the reference voltage line, the initialization voltage line, the second transistor T2, the fifth transistor T5, the sixth transistor T6, and the capacitor Cst. For example, the third transistor T3 may be connected to the capacitor Cst and receive the initialization voltage Vini through the initialization voltage line.

As another example, the first electrode of the third transistor T3 may be connected to the reference voltage line, the first electrode of the second transistor T2, and the first electrode of the fifth transistor T5. The second electrode of the third transistor T3 may be connected to the capacitor Cst and the second electrode of the sixth transistor T6.

In the exemplary embodiment, the third transistor T3 may be connected to the fourth node N4 and the fifth node N5. For example, the first electrode of the third transistor T3 may be connected to the fourth node N4. The second electrode of the third transistor T3 may be connected to the fifth node N5. The gate electrode of the third transistor T3 may be connected to the initialization voltage line. The third transistor T3 may be supplied with the initialization voltage Vini from the initialization voltage line. The third transistor T3 may be turned on or turned off according to the initialization voltage Vini.

The fourth transistor T4 may be connected to the emission signal line, the light emitting diode ED, the fifth transistor T5, the first transistor T1, and the driving transistor DT. For example, the fourth transistor T4 may be connected to the first electrode of the first transistor T1 and the second electrode of the driving transistor DT.

As another example, the first electrode of the fourth transistor T4 may be connected to the first electrode of the first transistor T1 and the second electrode of the driving transistor DT. The second electrode of the fourth transistor T4 may be connected to the second electrode of the fifth transistor T5 and the anode electrode of the light emitting diode ED. The gate electrode of the fourth transistor T4 may be connected to the emission signal line. The fourth transistor T4 may be supplied with the emission signal EM through the emission signal line. The fourth transistor T4 may be turned on or turned off according to the emission signal EM.

In the exemplary embodiment, the fourth transistor T4 may be connected to the third node N3 and the sixth node N6. For example, the first electrode of the fourth transistor T4 may be connected to the third node N3. The second electrode of the fourth transistor T4 may be connected to the sixth node N6.

The fifth transistor T5 may be connected to at least one of the reference voltage line, the second scan line, the first transistor T1, the second transistor T2, the third transistor T3, the fourth transistor T4, and the light emitting diode ED. For example, the fifth transistor T5 may be connected to the first transistor T1, the third transistor T3, and the fourth transistor T4.

As another example, the first electrode of the fifth transistor T5 may be connected to the reference voltage line and the first electrode of the third transistor T3. The second electrode of the fifth transistor T5 may be connected to the light emitting diode ED and the fourth transistor T4. The gate electrode of the fifth transistor T5 may be connected to the second scan line and the first transistor T1. The fifth transistor T5 may be supplied with the second scan signal Scan2 through the second scan line. The fifth transistor T5 may be turned on or turned off according to the second scan signal Scan2.

In the exemplary embodiment, the fifth transistor T5 may be connected to the fourth node N4 and the sixth node N6. For example, the first electrode of the fifth transistor T5 may be connected to the fourth node N4. The second electrode of the fifth transistor T5 may be connected to the sixth node N6.

The sixth transistor T6 may be connected to at least one of the data voltage line, the first scan line, the third transistor T3, and the capacitor Cst. For example, the sixth transistor T6 may be connected to the capacitor Cst and the third transistor T3.

As another example, the first electrode of the sixth transistor T6 may be connected to the data voltage line. The sixth transistor T6 may be supplied with the data voltage Vdata through the data voltage line. The second electrode of the sixth transistor T6 may be connected to the capacitor Cst and the second electrode of the third transistor T3. The gate electrode of the sixth transistor T6 may be connected to the first scan line. The sixth transistor T6 may be supplied with the first scan signal Scan1 through the first scan line. The sixth transistor T6 may be turned on or turned off according to the first scan signal Scan1.

In the exemplary embodiment, the sixth transistor T6 may be connected to the fifth node N5. For example, the second electrode of the sixth transistor T6 may be connected to the fifth node N5.

In the exemplary embodiment, the capacitor Cst may include a storage capacitor. The storage capacitor may be a component which charges an electric energy (for example, charges or a data voltage) to maintain a constant voltage for one frame. For example, when the input of the voltage stops during the process of driving a pixel circuit, the capacitor Cst supplies a stored electric energy to the driving transistor DT to maintain the driving of the driving transistor DT for one frame. The capacitor Cst may be configured by a parasitic capacitor which is an internal capacitor. However, it is not limited thereto and the capacitor Cst may be an external capacitor disposed at the outside of the driving transistor DT.

The capacitor Cst may be connected to at least one of the first transistor T1, the second transistor T2, the third transistor T3, the sixth transistor T6, and the driving transistor DT. For example, the first electrode of the capacitor Cst may be connected to the third transistor T3 and the sixth transistor T6. The second electrode of the capacitor Cst may be connected to the first transistor T1, the second transistor T2, and the driving transistor DT. As another example, the capacitor Cst may be connected to the gate electrode of the driving transistor DT.

In the exemplary embodiment, the capacitor Cst may be connected to the second node N2 and the fifth node N5. For example, the first electrode of the capacitor Cst may be connected to the fifth node N5. The second electrode of the capacitor Cst may be connected to the second node N2.

The light emitting diode ED may be connected to at least one of the low potential voltage line, the fourth transistor T4, and the fifth transistor T5. For example, the anode electrode of the light emitting diode ED may be connected to the fourth transistor T4 and the fifth transistor T5. The cathode electrode of the light emitting diode ED may be connected to the low potential voltage line. The low potential power line may include a line which supplies the low potential voltage VSS. The low potential voltage VSS may be determined in advance as a value lower than the above-described high potential voltage VDD.

In the exemplary embodiment, the light emitting diode ED may include an anode electrode, an emission layer, and a cathode electrode. The light emitting diode ED may include at least one of an organic light emitting diode, an inorganic light emitting diode, and a quantum dot light emitting diode. When the light emitting diode ED is an organic light emitting diode, the emission layer of the light emitting diode ED may include an organic emission layer including an organic material.

Figure 6:
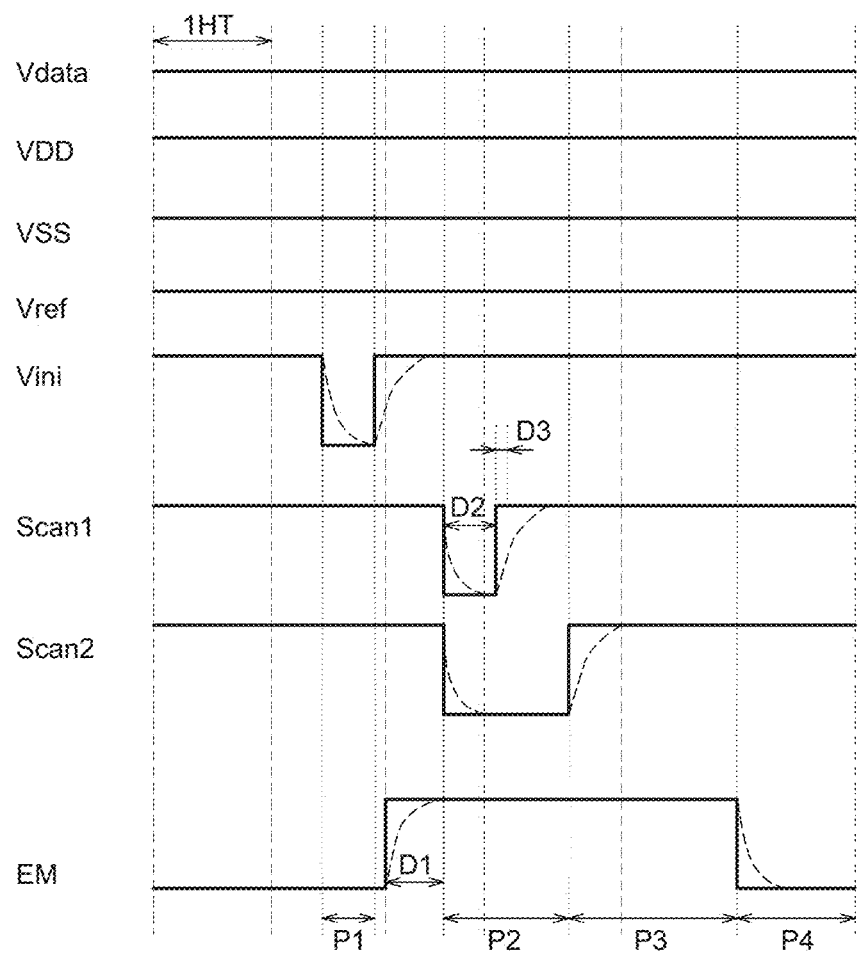
FIG. 6 illustrates an example of a signal timing of a display apparatus according to an exemplary embodiment of the present disclosure.

FIG. 6 illustrates an example of a signal timing of a display apparatus according to an exemplary embodiment of the present disclosure. FIG. 6 is a view for explaining a timing of a signal to be supplied to a pixel circuit of a display apparatus. Hereinafter, exemplary embodiments will be described using terms of a low level voltage and a high level voltage. However, the exemplary embodiments are not limited to this term, and according to the exemplary embodiment, the low level voltage may be referred to as a first voltage level and the high level voltage may be referred to as a second voltage level.

Referring to FIG. 6, the pixel circuit may have a plurality of operation periods. The pixel circuit may operate in a first driving period P1, a second driving period P2, a third driving period P3, and a fourth driving period P4. For example, the first driving period P1 may include an initialization (initial) period. The second driving period P2 may include a sampling period. The third driving period P3 may include a holding period. The fourth driving period P4 may include an emission period.

In the exemplary embodiment, a horizontal time HT may be a time period in which one pixel row is on and off one time. If the display panel includes five pixel rows, a time when the display panel is on and off one time may correspond to a time period in which all five pixel rows are on and off one time, for example, 5 HT. The time when the display panel is on and off one time may be referred to as one frame.

For example, when the display panel includes five pixel rows, one frame may be 5 HT.

In FIG. 6, a solid line denotes a timing when a signal is controlled to be provided and a dotted line denotes a timing when a provided signal is actually reflected. That is, even though the signal is provided as represented by the solid line, actually, the signal may be applied as represented by the dotted line, due to various issues such as delay. However, the exemplary embodiments of the present disclosure are not limited by the actually applied aspect.

In the exemplary embodiment, in the first driving period P1 to fourth driving period P4, the pixel circuit may be supplied with the data voltage Vdata, the reference voltage Vref, the high potential voltage VDD, and the low potential voltage VSS. The data voltage Vdata may be changed according to a screen to be displayed through the display apparatus and may be an AC voltage. The reference voltage Vref, the high potential voltage VDD, and the low potential voltage VSS are voltages each having a predetermined value and may be supplied to the pixel circuit during the first driving period P1 to fourth driving period P4.

In the exemplary embodiment, during the first driving period P1 to fourth driving period P4, the pixel circuit may be supplied with at least one of the initialization voltage Vini, the first scan signal Scan1, the second scan signal Scan2, and the emission signal EM. At least one signal which is provided for every driving period will be described below.

In the exemplary embodiment, the first driving period P1 may be an initialization period. The first driving period P1 may be performed before supplying the data voltage Vdata. During the first driving period P1, the initialization voltage Vini and the emission signal EM may be input as low level voltages. During the first driving period P1, the first scan signal Scan1 and the second scan signal Scan2 may be input as high level voltages.

Here, the low level voltage may be lower than the high level voltage. The low level voltage belongs to a range of a voltage value which is capable of turning on the p type TFT or turning off the n type TFT, for example, may include a voltage within −8 V and −12 V. However, the exemplary embodiment of the present disclosure is not limited thereto. The high level voltage belongs to a range of a voltage value which is capable of turning off the p type TFT or turning on the n type TFT, for example, may include a voltage within 6 V and 16 V. However, the exemplary embodiment of the present disclosure is not limited thereto.

In the exemplary embodiment, the first driving period P1 may be maintained while inputting the initialization voltage Vini as a low level voltage. When the initialization voltage Vini is changed from a low level voltage to a high level voltage, the first driving period P1 may end. A time (or point) when the signal is changed from the low level voltage to the high level voltage may be referred to as a rising time. A time when the signal is changed from the high level voltage to the low level voltage may be referred to as a falling time.

In the exemplary embodiment, after ending the first driving period P1, the emission signal EM may be changed from the low level voltage to the high level voltage. After the emission signal EM is changed to the high level voltage and a first duration D1 elapses, the second driving period P2 may start.

In the exemplary embodiment, the display apparatus may put a margin which is equal to or longer than the first duration D1 between the first driving period P1 and the second driving period P1, as illustrated in FIG. 6. In this case, a data mixing phenomenon in which a data voltage for a subsequent horizontal period is applied during the second driving period P2 may be effectively avoided. A time period between the first driving period P1 and the second driving period P2 may be referred to as a sampling margin period and corresponds to a difference of the first driving period P1 and the second driving period P2. A more specific example of the first driving period P1 will be described with reference to FIG. 7.

According to the exemplary embodiment, the first driving period P1 may be shifted. For example, the first driving period P1 may be shifted to increase the interval from the second driving period P2. In this case, within the second driving period P2, a sampling margin which suppresses the data mixture may be further ensured. A more specific example of the second driving period P2 will be described with reference to FIG. 8.

In the exemplary embodiment, the second driving period P2 may be a sampling period. The second driving period P2 may be performed while supplying the data voltage Vdata to the pixel circuit. During the second driving period P2, the initialization voltage Vini and the emission signal EM may be input as high level voltages. During the second driving period P2, the first scan signal Scan1 and the second scan signal Scan2 may be input as low level voltages.

For example, during a second duration D2 from the start point of the second driving period P2, the first scan signal Scan1 may be input as a low level voltage. During the second driving period P2, the second scan signal Scan2 may be input as a low level voltage.

According to the exemplary embodiment, during the second driving period P2, as the second scan signal Scan2 is input as a low level voltage, the first transistor T1 and the fifth transistor T5 may be turned on. The sampling operation may be performed based on the turned-on state of the first transistor T1. The initialization of the light emitting diode ED may be performed based on the turned-on state of the fifth transistor T5.

According to the exemplary embodiment, the initialization of the light emitting diode ED is performed based on the turned-on state of the fifth transistor T5 so that the second driving period P2 may be referred to as a light emitting diode initialization period. However, the exemplary embodiment is not limited by the term.

In the exemplary embodiment, as illustrated in FIG. 6, the display apparatus may have a third duration D3 starting from an end time of the second duration D2, for example, an end time of the low level voltage of the first scan signal Scan1. The third duration D3 may be an additional margin for suppressing the mixture of the data of the subsequent horizontal period. Accordingly, the data mixture may be more effectively avoided.

In the exemplary embodiment, the third driving period P3 may be a holding period. The third driving period P3 is a period in which a state of the start point is maintained so that during the third driving period P3, the operation of the pixel circuit may not be changed. For example, during the third driving period P3, a state immediately after the second driving period P2, such as a momentary pause without applying a voltage to the pixel circuit may be constantly maintained.

During the third driving period P3, the initialization voltage Vini, the emission signal EM, the first scan signal Scan1, and the second scan signal Scan2 may be input as high level voltages. A more specific example of the third driving period P3 will be described with reference to FIG. 9.

In the exemplary embodiment, the fourth driving period P4 may be an emission period. During the fourth driving period P4, the light emitting diode ED may emit light. During the fourth driving period P4, the initialization voltage Vini, the first scan signal Scan1 and the second scan signal Scan2 may be input as high level voltages. During the fourth driving period P4, the emission signal EM may be input as a low level voltage. A more specific example of the fourth driving period P4 will be described with reference to FIG. 10.

Figure 7:
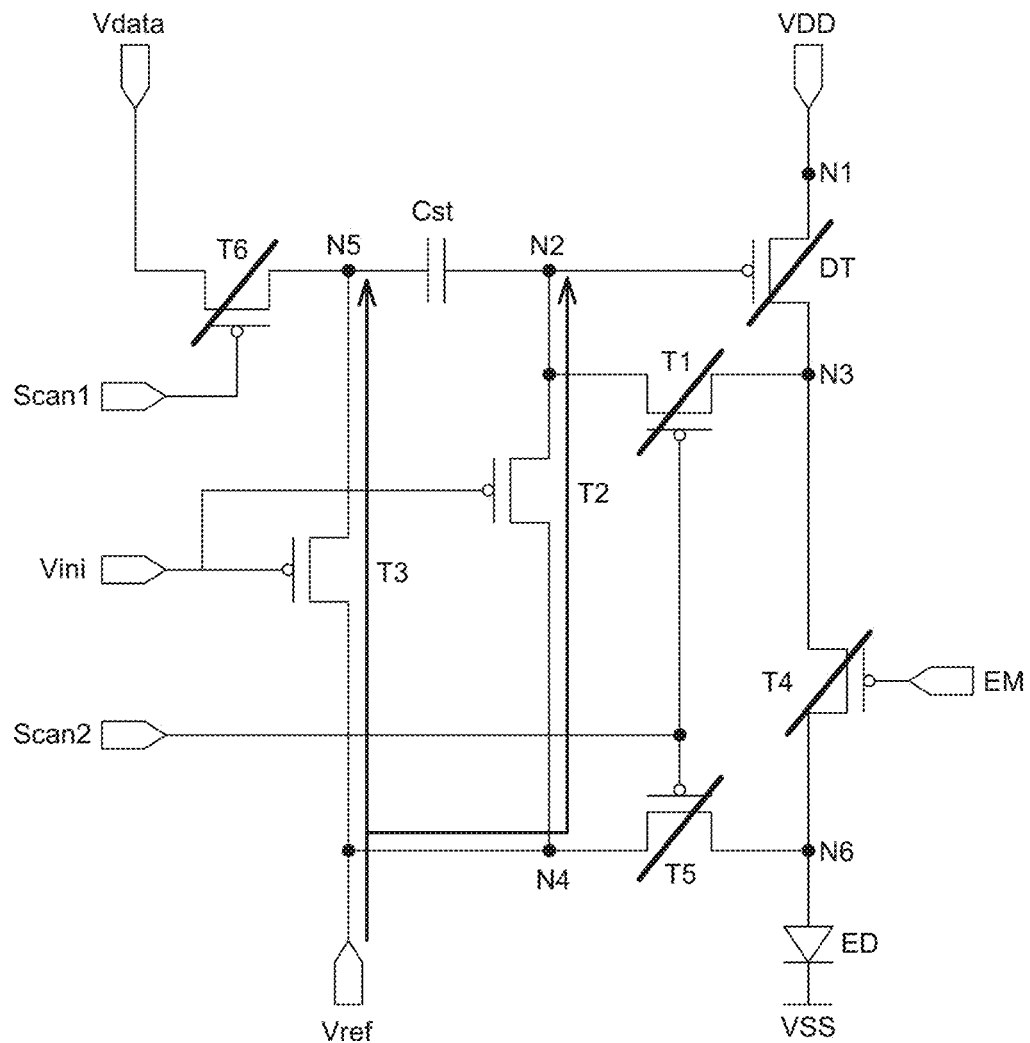
FIG. 7 is a view for explaining the driving of a pixel circuit of a display apparatus according to an exemplary embodiment of the present disclosure in a first driving period.

FIG. 7 is a view for explaining the driving of a pixel circuit of a display apparatus according to an exemplary embodiment of the present disclosure in a first driving period. Specifically, FIG. 7 illustrates an example of an operation of a pixel circuit during an initialization period.

During the first driving period, the initialization voltage Vini may be input as a low level voltage. In this case, during the first driving period, the second transistor T2 and the third transistor T3 may be turned on. During the first driving period, the first transistor T1, the fourth to sixth transistors T4 to T6, and the driving transistor DT may be turned off.

Referring to FIG. 7, as the second transistor T2 and the third transistor T3 are turned on, the reference voltage Vref may be provided to both ends (for example, the first electrode and the second electrode) of the capacitor Cst via the second transistor T2 and the third transistor T3. As the reference voltage Vref is supplied to both ends of the capacitor Cst, the initialization may be performed.

Figure 8:
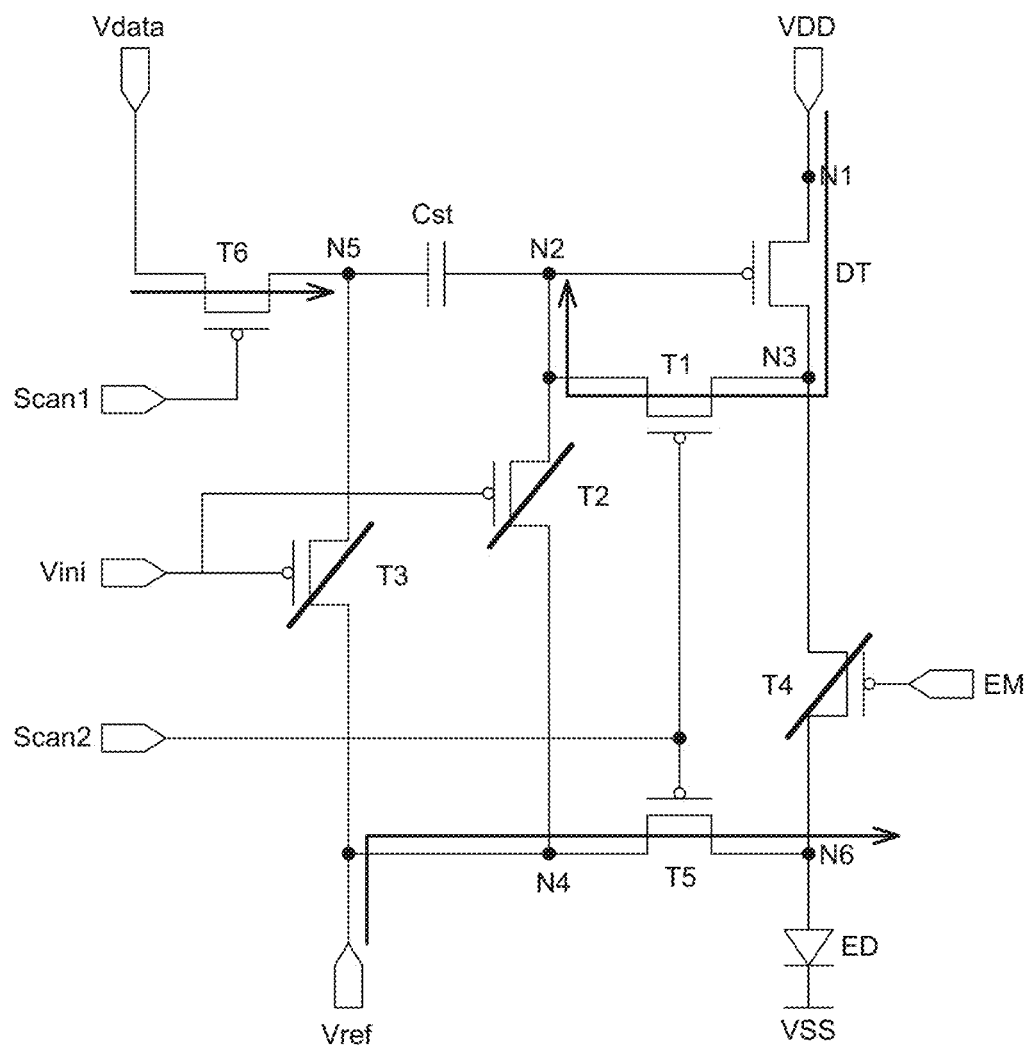
FIG. 8 is a view for explaining the driving of a pixel circuit of a display apparatus according to an exemplary embodiment of the present disclosure in a second driving period.

FIG. 8 is a view for explaining the driving of a pixel circuit of a display apparatus according to an exemplary embodiment of the present disclosure in a second driving period. Specifically, FIG. 8 illustrates an example of an operation of a pixel circuit during a sampling period.

During the second driving period P2, the first scan signal Scan1 and the second scan signal Scan2 may be input as low level voltages. In this case, the first transistor T1, the fifth transistor T5 and the sixth transistor T6 may be turned on.

The sampling of a threshold voltage Vth of the driving transistor DT may be performed based on a turned-on state of the first transistor T1. The reference voltage Vref may be input to the sixth node N6 via the fifth transistor T5 based on the turned-on state of the fifth transistor T5. The anode electrode of the light emitting diode ED may be connected to the sixth node N6 and thus the light emitting diode ED may be initialized. The data voltage Vdata may be input to the fifth node N5 via the sixth transistor T6 based on the turned-on state of the sixth transistor T6. In this case, the data voltage Vdata is charged at one end of the capacitor Cst and thus data writing may be performed.

Figure 9:
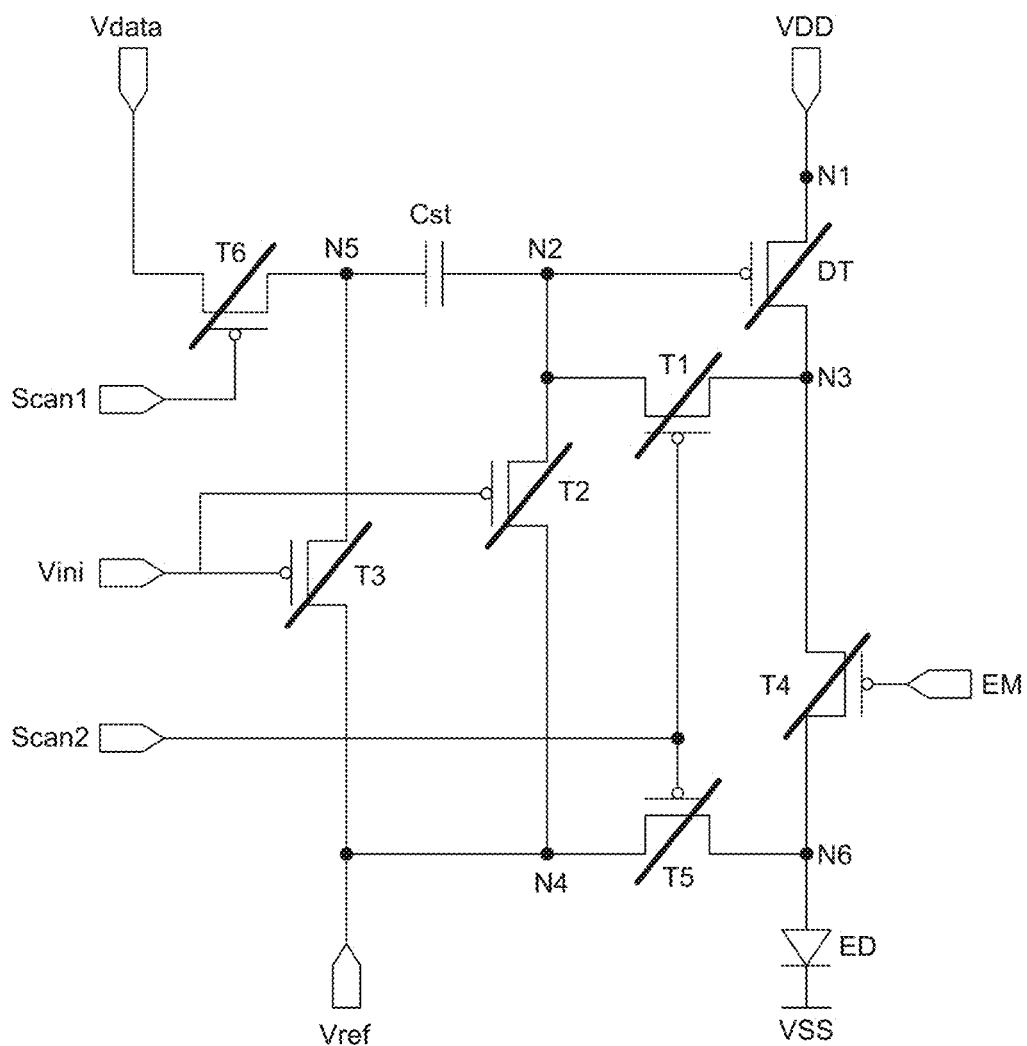
FIG. 9 is a view for explaining the driving of a pixel circuit of a display apparatus according to an exemplary embodiment of the present disclosure in a third driving period.

FIG. 9 is a view for explaining the driving of a pixel circuit of a display apparatus according to an exemplary embodiment of the present disclosure in a third driving period. FIG. 9 illustrates an example of an operation of a pixel circuit during a holding period.

Referring to FIG. 9, during the third driving period, the driving transistor DT and the first to sixth transistors T1 to T6 may be turned off. Therefore, the previous state may be maintained without causing a separate current flow in the pixel circuit. As described above, the third driving period in which a previous state is maintained as described above may be referred to as a holding period.

Figure 10:
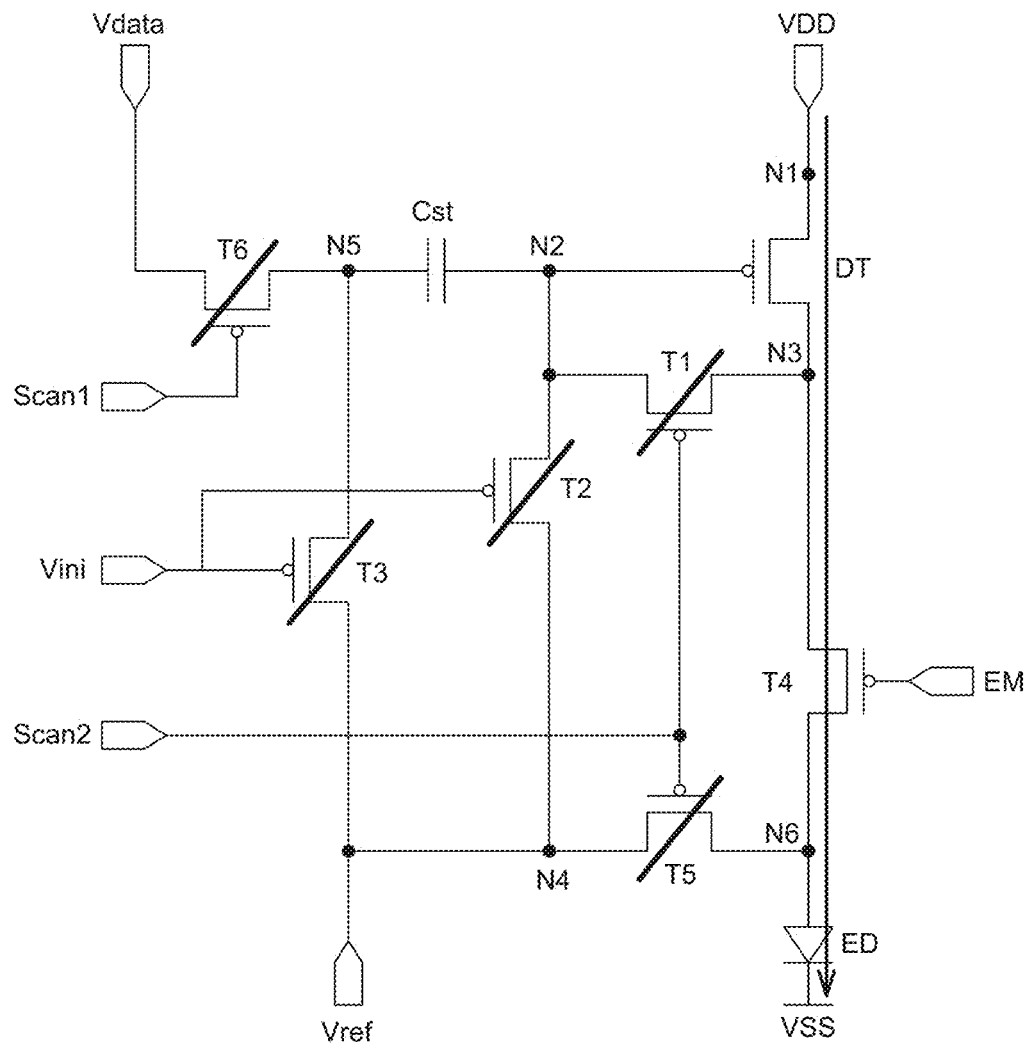
FIG. 10 is a view for explaining the driving of a pixel circuit of a display apparatus according to an exemplary embodiment of the present disclosure in a fourth driving period.

FIG. 10 is a view for explaining the driving of a pixel circuit of a display apparatus according to an exemplary embodiment of the present disclosure in a fourth driving period. FIG. 10 illustrates an example of an operation of a pixel circuit during an emission period.

Referring to FIG. 10, during the fourth driving period, the driving transistor DT and the fourth transistor T4 may be turned on. A driving current supplied from the turned-on driving transistor DT may be transmitted to the light emitting diode ED via the fourth transistor T4, based on the turned-on state of the fourth transistor T4. As the driving current is input to the anode electrode of the light emitting diode ED, the light emitting diode ED may emit light. As described above, a period in which the light emitting diode ED emits light may be referred to as an emission period.

In the exemplary embodiment, a driving period of FIGS. 7 to 10, that is, the first driving period, the second driving period, the third driving period, and the fourth driving period may be sequentially performed. However, it is not limited thereto and if necessary, another period may be added or at least one period may be omitted between at least two periods. Further, if necessary, an order of at least some periods of the first driving period to the fourth driving period may be changed.

The exemplary embodiments of the present disclosure can also be described as follows:

A pixel circuit according to an exemplary embodiment of the present disclosure includes: a driving transistor including a gate electrode, a first electrode, and a second electrode; a capacitor connected to the gate electrode; a first transistor connected to the gate electrode and the second electrode; a second transistor which is connected to the first transistor and receives an initialization voltage; a third transistor which is connected to the capacitor and receives the initialization voltage; a fourth transistor connected to the first transistor and the second electrode; a fifth transistor connected to the first transistor, the third transistor, and the fourth transistor; and a light emitting diode connected to the fourth transistor and the fifth transistor.

The pixel circuit may further include a sixth transistor which may be connected to the capacitor and the third transistor.

A high potential voltage may be input to the first electrode of the driving transistor, a first scan signal may be input to the sixth transistor, a second scan signal may be input to the first transistor and the fifth transistor, and an emission signal may be input to the fourth transistor.

A reference voltage is input to the third transistor and the fifth transistor and a data voltage is input to the sixth transistor.

The pixel circuit operates in an initial period, a sampling period, a holding period, and an emission period and during the initial period, the second transistor and the third transistor may be turned on based on the initialization voltage having a first voltage level.

During the sampling period, the first transistor, the fifth transistor, and the sixth transistor may be turned on based on the first scan signal and the second scan signal having the first voltage level.

During the holding period, the first to sixth transistors may be turned off based on the initialization voltage, the first scan signal, the second scan signal, and the emission signal having a second voltage level.

During the emission period, the fourth transistor may be turned on based on the emission signal having the first voltage level.

A display apparatus according to an exemplary embodiment of the present disclosure includes: a display panel which includes a pixel circuit; a power source which is electrically connected to the display panel to supply at least one of a high potential voltage, a low potential voltage, an initialization voltage, and a reference voltage; a data driving circuit which is electrically connected to the display panel to supply a data voltage; and a gate driving circuit which is electrically connected to the display panel to supply at least one of a first scan signal, a second scan signal, and an emission signal. The pixel circuit includes: a driving transistor including a gate electrode, a first electrode, and a second electrode; a capacitor connected to the gate electrode; a first transistor connected to the gate electrode and the second electrode; a second transistor which is connected to the first transistor and receives the initialization voltage; a third transistor which is connected to the capacitor and receives the initialization voltage; a fourth transistor connected to the first transistor and the second electrode; a fifth transistor connected to the first transistor, the third transistor, and the fourth transistor; and a light emitting diode connected to the fourth transistor and the fifth transistor.

The display apparatus may further include a sixth transistor connected to the capacitor and the third transistor.

The high potential voltage may be input to the first electrode of the driving transistor, the first scan signal may be input to the sixth transistor, the second scan signal may be input to the first transistor and the fifth transistor, and the emission signal may be input to the fourth transistor.

The reference voltage may be input to the third transistor and the fifth transistor and the data voltage may be input to the sixth transistor.

The pixel circuit operates in an initial period, a sampling period, a holding period, and an emission period and during the initial period, the second transistor and the third transistor may be turned on based on the initialization voltage having a first voltage level.

During the sampling period, the first transistor, the fifth transistor, and the sixth transistor may be turned on based on the first scan signal and the second scan signal having the first voltage level.

During the holding period, the first to sixth transistors may be turned off based on the initialization voltage, the first scan signal, the second scan signal, and the emission signal having a second voltage level.

During the emission period, the fourth transistor may be turned on based on the emission signal having the first voltage level.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A pixel circuit, comprising:
a driving transistor including a gate electrode, a first electrode, and a second electrode;
a capacitor connected to the gate electrode;
a first transistor connected to the gate electrode and the second electrode;
a second transistor which is connected to the first transistor and is configured to receive an initialization voltage;
a third transistor which is connected to the capacitor and is configured to receive the initialization voltage;
a fourth transistor connected to the first transistor and the second electrode;
a fifth transistor connected to the first transistor, the third transistor, and the fourth transistor; and
a light emitting diode connected to the fourth transistor and the fifth transistor, wherein, during one frame, each of a turn-on period of the second transistor and a turn-on period of the third transistor does not overlap with a turn-off period of the fourth transistor.

2. The pixel circuit according to claim 1, further comprising:
a sixth transistor connected to the capacitor and the third transistor.

3. The pixel circuit according to claim 2, wherein a high potential voltage is input to the first electrode of the driving transistor, a first scan signal is input to the sixth transistor, a second scan signal is input to the first transistor and the fifth transistor, and an emission signal is input to the fourth transistor.

4. The pixel circuit according to claim 3, wherein the pixel circuit operates in an initial period, a sampling period, a holding period, and an emission period and during the initial period, the second transistor and the third transistor are turned on based on the initialization voltage having a first voltage level.

5. The pixel circuit according to claim 4, wherein during the sampling period, the first transistor, the fifth transistor, and the sixth transistor are turned on based on the first scan signal and the second scan signal having the first voltage level.

6. The pixel circuit according to claim 4, wherein during the holding period, the first to sixth transistors are turned off based on the initialization voltage, the first scan signal, the second scan signal, and the emission signal having a second voltage level.

7. The pixel circuit according to claim 4, wherein during the emission period, the fourth transistor is turned on based on the emission signal having the first voltage level.

8. The pixel circuit according to claim 2, wherein a reference voltage is input to the third transistor and the fifth transistor and a data voltage is input to the sixth transistor.

* * * * *